United States Patent
Pasdast et al.

(10) Patent No.: US 10,686,582 B1
(45) Date of Patent: Jun. 16, 2020

(54) CLOCK PHASE COMPENSATION APPARATUS AND METHOD

(71) Applicant: Intel Corporation, Santa Clara, CA (US)

(72) Inventors: Gerald Pasdast, San Jose, CA (US); Nasser A. Kurd, Portland, OR (US); Peipei Wang, San Jose, CA (US); Yingyu Miao, Cupertino, CA (US); Lakshmipriya Seshan, Santa Clara, CA (US); Ishaan S. Shah, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/285,056

(22) Filed: Feb. 25, 2019

(51) Int. Cl.
| | |
|---|---|
| *H04L 7/00* | (2006.01) |
| *H03L 7/081* | (2006.01) |
| *H03L 7/093* | (2006.01) |
| *H03K 5/00* | (2006.01) |
| *G06F 1/08* | (2006.01) |
| *G06F 1/10* | (2006.01) |
| *G06F 1/06* | (2006.01) |
| *H03K 3/037* | (2006.01) |

(52) U.S. Cl.
CPC ............ *H04L 7/0008* (2013.01); *G06F 1/06* (2013.01); *G06F 1/08* (2013.01); *G06F 1/10* (2013.01); *H03K 3/037* (2013.01); *H03K 5/00* (2013.01); *H03L 7/0812* (2013.01); *H03L 7/093* (2013.01); *H03K 2005/00019* (2013.01)

(58) Field of Classification Search
CPC ...... H04L 7/0008; H04L 7/033; H04L 7/0331; G06F 1/06; G06F 1/08; G06F 1/10; G06F 5/06; G06F 1/04; H03L 7/0812; H03L 7/091; H03L 7/0814; H03L 7/093; H03L 7/0816; H03K 5/135; H03K 3/037; H03K 5/00

See application file for complete search history.

(56) References Cited

U.S. PATENT DOCUMENTS

| | | | | |
|---|---|---|---|---|
| 10,348,281 | B1 * | 7/2019 | Oliver ...................... | G06F 1/08 |
| 2002/0196883 | A1 * | 12/2002 | Best ......................... | G06F 1/10 375/355 |
| 2004/0119521 | A1 * | 6/2004 | Kurd ........................ | G06F 1/10 327/291 |
| 2012/0187991 | A1 * | 7/2012 | Sathe ....................... | H03K 5/135 327/158 |
| 2014/0254737 | A1 * | 9/2014 | Reyes, Jr. ................ | G21C 19/07 376/272 |

(Continued)

*Primary Examiner* — Khanh C Tran
(74) *Attorney, Agent, or Firm* — Green, Howard & Mughal LLP

(57) ABSTRACT

An apparatus and method is provided that compensates for the supply droops to minimize strobe shifts and to regain eye margin. The apparatus includes a droop detector to detect voltage droops at one or more trip (or threshold) levels and these detected voltage droops are translated to a shift in clock phase setting. For example, propagation delay of a delay locked loop (DLL) and/or clock edge selection from a phase interpolator (PI) is adjusted according to the detected voltage droop levels to maintain a trained relationship between the sampling clock strobe and data eye. A lookup table is used to determine a PI code or a DLL propagation delay code corresponding to a voltage droop level.

21 Claims, 7 Drawing Sheets

(56) References Cited

U.S. PATENT DOCUMENTS

2017/0344102 A1\* 11/2017 Kolla ................ G06F 1/324
2018/0175839 A1\* 6/2018 Bandi ................ H03K 5/14
2018/0284828 A1\* 10/2018 Mosalikanti ........... H03L 7/093

\* cited by examiner

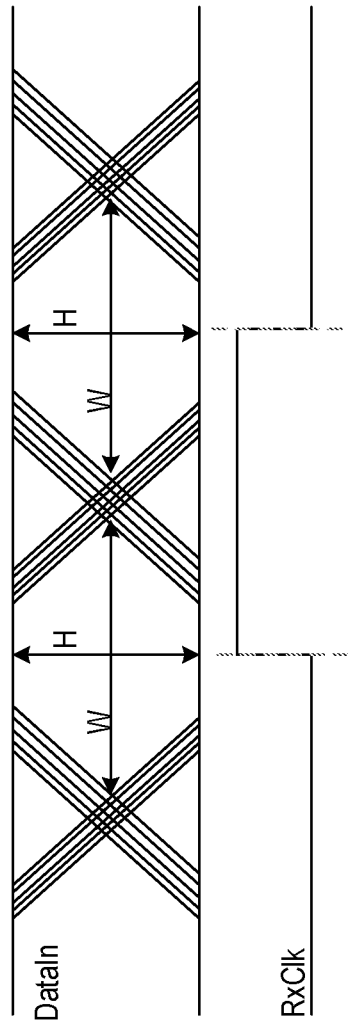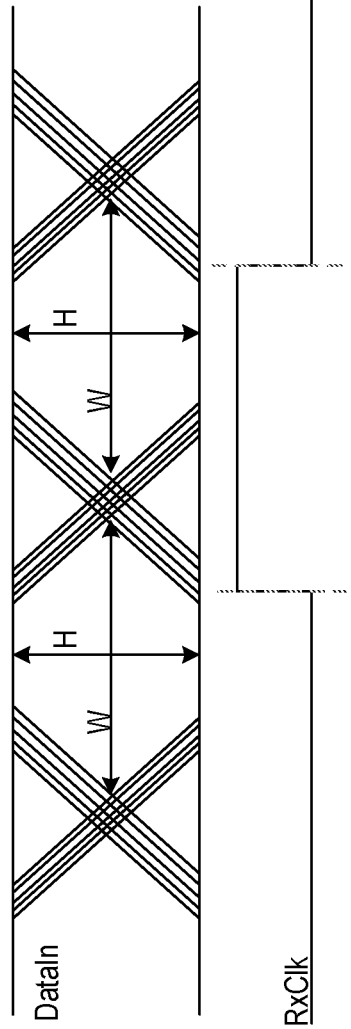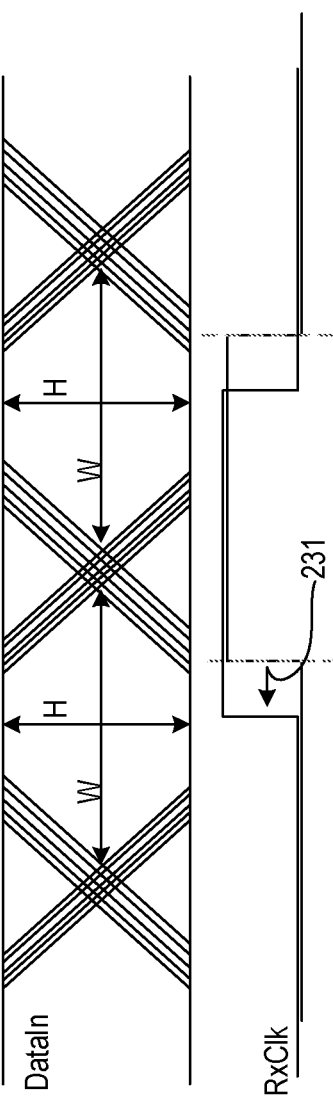

| Droop | Droop Threshold Level | Threshold Voltage | PI Code | DLL delay code |
|---|---|---|---|---|
| 0 | x | v1 | 0000 | 0000 |
| 1 | 0 | v2 | 0001 | 0001 |
| 1 | 1 | v3 | 0010 | 0010 |
| 1 | 2 | v4 | 0011 | 0011 |
| ----- | ----- | ----- | ----- | ----- |
| 1 | 14 | v15 | 1111 | 1111 |

Fig. 5

CLOCK PHASE COMPENSATION APPARATUS AND METHOD

BACKGROUND

Supply droop-induced clock phase shifts cause significant eye margin loss in source-synchronous IOs that are based on unmatched receiver (RX) clocking architectures. An eye diagram illustrates the eye margin. A data eye diagram is put together by folding parts of a data waveform corresponding to each individual data bit into a single graph with signal amplitude on the vertical axis and time on horizontal axis. The data bit is the data being transmitted or received at a node. By repeating this construction over many samples of the waveform, the resultant graph represents average statistics of the signal and resembles an eye. The eye opening corresponds to a 1-bit period and is called a Unit Interval (UI) width of the eye diagram. An ideal eye diagram exhibits sharp rise and fall times and a constant amplitude. The data is sampled by placing a sampling clock edge in the middle of the eye. With power supply voltage and/or current droop, the unmatched RX may suffer from mismatch in data and clock propagation delays. For example, unmatched RX architectures where clock and data paths may not have matched propagation delays, have a low power advantage compared to matched architectures, but large supply droops can significantly shift a trained sampling clock strobe edge with respect to the data eye. This shifted clock strobe edge reduces IO timing margin.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIGS. 2A-C illustrate plots showing eye diagram and sampling clock edge in three situations—no supply voltage droop, with supply voltage droop and without clock compensation, and with supply voltage droop and clock compensation, respectively, in accordance with some embodiments.

FIG. 5 illustrates a lookup table to select an appropriate PI code according to the droop or rise level, in accordance with some embodiments.

DETAILED DESCRIPTION

Figure 1:
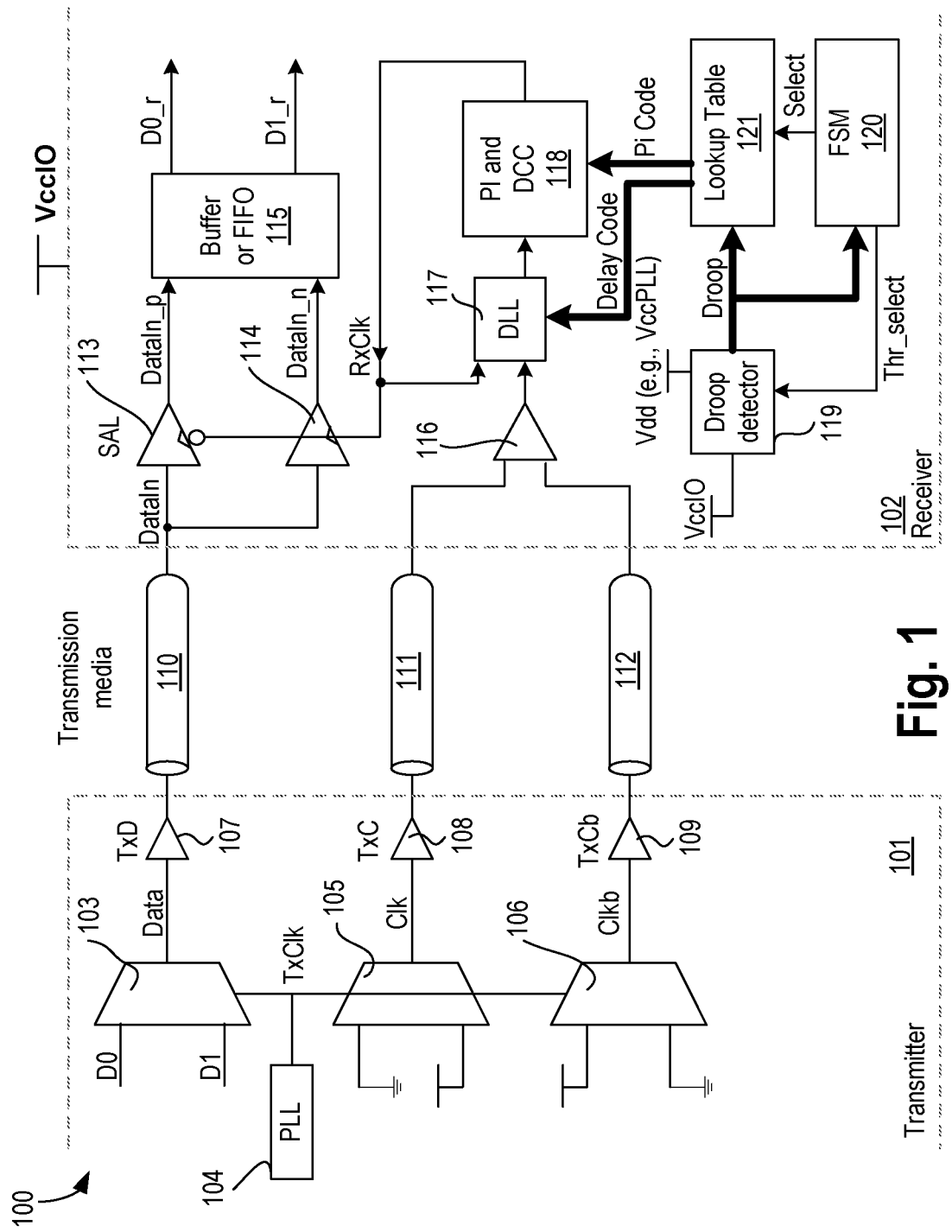
FIG. 1 illustrates a system architecture with a receiver that compensates receiver sampling clock for voltage droop or rise on a receiver power supply rail, according to some embodiments of the disclosure.

One way to compensate for potential timing mismatch between clock and data in a receiver is to match the clock and data propagation paths. In some embodiments, in a matched RX architecture, a voltage droop or rise in the power supply voltage is compensated by matching the shift induced on the data eye edge on the data eye relative to the data. For example, replica delay lines on the RX data input paths are used that match the clocking (strobe) input delay path. However, such a compensation scheme may not be available for unmatched RX architectures where clock and data paths are inherently mismatched. In some embodiments, an apparatus and corresponding method is provided that compensates for the supply droops to minimize strobe shifts and to regain eye margin. This eye margin gain can be traded for higher operating frequencies or lower power, in some examples.

In some embodiments, an apparatus for compensating clock phase in an unmatched receiver architecture includes a droop or rise detector to detect voltage droops or rise at one or more trip (or threshold) levels. These detected voltage droops or rise are translated to a shift in clock phase setting. For example, propagation delay of a delay locked loop (DLL) and/or clock edge selection from a phase interpolator (PI) is adjusted according to the detected voltage droop or rise levels to maintain a trained relationship between the sampling clock strobe and data eye. In some embodiments, a lookup table is used to determine a PI code or a DLL propagation delay code corresponding to a voltage droop level. For example, characterization of test chip having such apparatus can be used to determine the translation lookup table for voltage droop or rise levels versus DLL/PI phase settings.

There are many technical effects of various embodiments. For example, the apparatus of some embodiments significantly reduces source-synchronous input-output (IO) margin loss due to supply droop or rise events. This reduction of margin loss can be directly translated to higher IO data rates or lowered power supply voltage settings for power savings. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e g, immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

FIG. 1 illustrates a system architecture 100 with a receiver that compensates receiver sampling clock for voltage droop, according to some embodiments of the disclosure. In this example, system 100 is a simplified system which comprises transmitter 101 and receiver 102, where transmitter 101 and receiver 102 are coupled by transmission media. Transmitter 101 comprises data multiplexer 103, phase locked loop (PLL) 104, first clock multiplexer 105, and second clock multiplexer 106, data transmitter 107, first clock transmitter 108, and second clock transmitter 109. The transmission media includes data line 110, first clock line 111, and second clock line 112.

PLL 104 generates the transmit clock (TxClk) which is used to sample data D0 and D1 to generate serial output Data. This Data is then driven to receiver 102 over transmission line 110 via data transmitter TxD. TxClk is also used to generate clock Clk and its inverse or complementary signal Clkb via multiplexers 105 and 106 respectively. By using TxClk as the select signal and tying the inputs of the multiplexers 105 and 106 with ground and supply, Clk and Clkb signals are generated. These clock signals are transmitted by their respective transmitters 108 (TxC) and 109 (TxCb) over transmission lines 111 and 112, respectively, to receiver 102. The embodiments are not limited to this particular transmitter architecture. Any transmitter architecture that sends data and its sampling clock to a receiver can be used. In some embodiments, clock is not transmitted to receiver 102, and a clock data recovery circuitry is used at the receiver to regenerate the clock from the received data DataIn.

In this system, both data and clocks are sent from transmitter 101 to receiver 102. The clocks are differential clocks (Clk and Clkb) that are sent via separate transmission lines 111 and 112. In some embodiments, receiver 102 comprises data receiving amplifiers 113 and 114, logic 115, clock amplifier 116, delay locked loop (DLL) 117, phase interpolator (PI) and/or duty cycle corrector (DCC) 118, droop or rise detector 119, finite state machine (FSM) 120, and lookup table 121. Serial data transmitted by TxD 107 is received as DataIn by receiver 102, where it is sensed and amplified by amplifiers 113 and 114.

DataIn at receiver 102 represents the incoming serialized data stream from transmitter 101. In this example, DataIn is a 2× (or double) data rate signal. In a double data rate signal, Data is transmitted to receiver 102 at the rising and falling edges of Clk and Clkb from transmitter 101. The signal quality of DataIn is degraded after traveling through transmission media 110, and may need to be amplified and re-timed by receiver 102. In various embodiments, SAL 113 and 114 sample DataIn. For example, rising edge of RxClk triggers a capture by SAL 114, and falling edge of RxClk triggers capture by SAL 113. The outputs DataIn_p from SAL 113 and DataIn_n from SAL 114 are parallel outputs that are re-timed and digitized outputs. These signals (DataIn_p and DataIn_n) are full rail-to-rail digital signals and represent the de-serialized version of DataIn. As such, data versions of D0 and D1 at transmitter 101 are re-created at receiver 102. In some embodiments, DataIn_o and DataIn_n are buffered or re-timed by logic 115. Logic 115 may include a plurality of registers organized as a FIFO (first-in-first-out). Logic 114 may comprise a flip-flop repeater circuitry or clock crossing FIFO that generates D0_r and D1_r that correspond to D0 and D1 at transmitter 101.

The output of logic 115 is DataOut. In some embodiments, amplifiers 113 and 114 are strong arm latches (SALs) that amplify the input signal DataIn and sample the detected input DataIn using receiver clock RxClk. Here, the rising edge of RxClk is used by amplifier 113 to sample DataIn and generate DataIn_p while the falling edge of RxClk is used by amplifier 114 to generate DataIn_n. In some embodiments, amplifiers 113 and 114 are clocked comparators.

The electrical path from DataIn to DataOut is the data path. The remaining part of receiver 102 shown here is the clock path. Clocks Clk and Clkb from transmitter 101 are receive by differential amplifier 116 that generates a single-ended clock as output of amplifier 116. This single-ended clock is then used as a reference clock by DLL 117. The output of DLL 117 is a delay locked clock which is phase interpolated to generate RxClk which has transmission edges centered in the eye of DataIn. PI 118 can adjust the phase of the RxClk by fine amounts (e.g., 1 picoseconds) while DLL 117 can adjust the phase of RxClk by coarse amounts (e.g., ½ UE, ¼ UE).

FIG. 2A illustrates plot 200 showing an eye diagram and sampling clock edge in an ideal situation when there is no voltage droop. Here, 'W' is the width of the data eye (e.g., after multiple signals of DataIn are plotted over one another), and 'H' is the height of the data eye. RxClk is set to have its transmission edges in the middle of the data eye to capture or sample the data properly and with timing margin.

Referring back to FIG. 1, in some embodiments, RxClk is also duty cycle corrected by a duty cycle corrector (DCC). For example, if RxClk has a non-50% duty cycle because its low or high phases are not equal in duration, then DCC compensates for that by adjusting the phase durations to make the low or high phases equal. Here, for simplicity, both PI and DCC are lumped in circuitry 118. Any suitable PI and DCC may be used here. For example, PI may be a network of current starved inverters and/or analog multiplexers, or current source based PI. A person skilled in the art would appreciate that in system 100 the clock and data paths have different propagation delays. The data path comprises SALs 113 114 that latch the input data DataIn while the clock path comprises differential amplifier 116, DLL 117, PI and DCC 118. When the power supply (VccIO) for receiver 102 suffers from a voltage droop or rise above its nominal or expected voltage level, that voltage droop or rise pushes out RxClk (or pulls inRxClk) more relative to DataIn because of the mismatch of the propagation delays between the data and clock paths.

FIG. 2B illustrates plot 220 showing an eye diagram and sampling clock edge when there is voltage droop on VccIO (the power supply for receiver 102 that powers the various circuits of receiver 102), and no compensation. Because of the mismatched data and clock paths, the voltage droop on VccIO causes the RxClk to delay its edge more than the delay in the DataIn edges. As such, the sampling edges of RxClk are no longer positioned in the center of the DataIn eye. This may cause incorrect data sampling because DLL 117 may have a lower bandwidth than the frequency of the voltage droop causing the DLL to be unable to track DataIn. For example, the voltage droop on VccIO may occur at a faster rate than DLL 117 can track, which RxClk sampling phase is pushed out (or pulled in due to a VccIO rise event), and this leads to reduced IO timing margin. The shift in RxClk is due to the shifted VccIO supply level that changes the delay induced by the supply level reduction. After voltage droop or rise is over, the clock edge of RxClk may slowly re-align to the center of the data eye, but this process may be a long process and during that re-training of the RxClk, transmitter 101 may have to resend DataIn because DataIn was incorrectly sampled.

Referring back to FIG. 1, to compensate for the loss of timing margin caused by the voltage droop (or sudden voltage rise), Droop Detector 119, FSM 120, and lookup Table 121 are provided, in accordance with some embodiments. In some embodiments, Droop Detector 119 detects a sudden droop or rise in VccIO, and informs FSM 120 of such droop or rise. FSM 120 then instructs PI 118 (and/or DCC) and/or DLL 117 to adjust the phase of RxClk to sample DataIn in the middle of the DataIn eye. In some embodiments, multiple droop or rise levels of VccIO can be detected and a corresponding DLL phase shift (e.g., fine-grain phase shift can be accomplished by the usage of PI 118) can be mapped to each voltage threshold level to compensate for different supply droop or rise magnitudes.

In some embodiments, digital droop detection scheme is based on a computation of one or more valid signals (or similar). For example, digital droop detection scheme detects when DataIn is valid (e.g., when it will be toggling) and pre-shifts the phase of DLL 117 to compensate for the droop or rise in VccIO and reset after a period of time (or number of clock cycles). In some embodiments, threshold (e.g., analog or digital detection) trips are used with a mapping lookup table 121 to determine how many PI ticks to shift RxClk and in which direction. Table 121 can be trained per part of optimum performance goal or universally set based on silicon characterization across a wide sample of parts, in accordance with some embodiments.

FIG. 2C illustrates plot 230 showing an eye diagram and sampling clock edge when there is voltage droop on VccIO (the power supply for receiver 102 that powers the various circuits of receiver 102), and with clock compensation, in accordance with some embodiments. In this case, the pushed out RcClk due to voltage droop is then pulled in by a delay 231 by the apparatus of various embodiments. Upon detection of voltage droop or rise on VccIO, Droop detector 119 (which can also perform the function of voltage rise detection) generates a droop signal. In some embodiments, multiple droop signals (e.g., $Droop_{1-N}$) are generated for different voltage thresholds. As such, the magnitude and direction of voltage droop or rise is determined to know how much to pull or push RxClk by. In some embodiments, FSM 120 receives the droop signals for corresponding voltage thresholds. FSM 120 then looks up a PI Code according to the magnitude of droop or rise in VccIO from lookup table 121. The PI Code is a digital code that when decoded by PI 118, a particular edge of clock is selected to generate RxClk. Generally, PI 118 is more suitable for fine movement of clock edges.

In some embodiments, FSM 120 may determine that a large phase shift in RxClk is needed because the voltage droop or rise in VccIO is larger than the maximum fine time duration PI 118 can pull or push the RxClk edge by. In that case, FSM 120 may adjust the delay one or more delay stages of DLL 117 via Delay Code to cause a phase shift in RxClk more than a phase shift easily achievable by PI 118 alone. In some embodiments, FSM 120 may change the voltage thresholds for Droop Detector 119. For example, FSM 120 may issue a threshold select (Thr_select) signal, which may be one or more bits, to select one or more voltage thresholds from a variety of possible thresholds. As such, FSM 120 has the capability of determining the sensitivity of droop or voltage rise detection.

In some embodiments, lookup table 121 is a programmable table, which is filled up at boot time with values of voltage droop or rise levels, threshold levels, and PI codes according to silicon data. In some embodiments, lookup table 121 comprises fuse cells that are programmed with non-changeable values of voltage droop or rise levels, threshold levels, and PI codes at the time receiver 102 is manufactured. These values can be determined from simulations or silicon part calibration in a lab. In some embodiments, values in lookup table 121 can be programmed after booting up the processor. For example, lookup table 121 can be programmed by an operating system.

Figure 3:
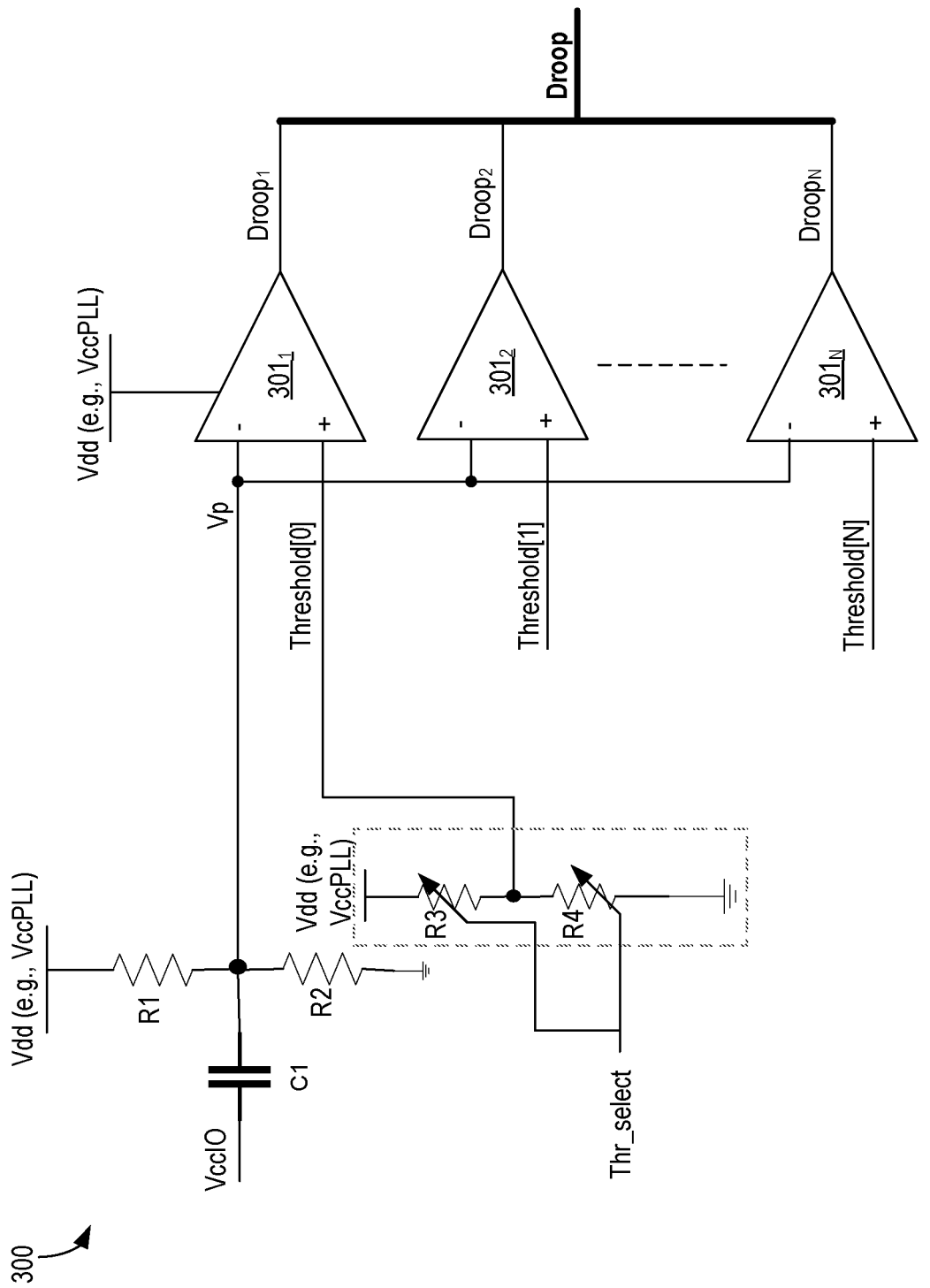
FIG. 3 illustrates a supply droop and rise detector with adjustable threshold, in accordance with some embodiments.

FIG. 3 illustrates a supply droop (or rise) detector apparatus 300 with adjustable threshold, in accordance with some embodiments. In some embodiments, apparatus 300 comprises comparators $301_{1-N}$, resistive devices R1 and R2 coupled to node Vp, resistive devices R3 and R4 coupled to node Threshold[0] through Threshold[N], and coupling capacitor C1 coupled to node Vp. Comparator $301_1$ compares the voltage on node Vp, which is a divided version of Vdd (e.g., PLL supply VccPLL), with a threshold (e.g., programmable threshold Threshold[0]). Comparator $301_2$ compares the voltage on node Vp, which is a divided version of Vdd (e.g., PLL supply VccPLL), with another threshold (e.g., programmable threshold Threshold[N]). Comparator $301_N$ compares the voltage on node Vp, which is a divided version of Vdd (e.g., PLL supply VccPLL), with another threshold (e.g., programmable threshold Threshold[N]). The output from each comparator is a corresponding droop bit signal. For example, the output of comparator $301_1$ is Droop$_S$, the output of comparator $301_2$ is Droop$_2$, and the output of comparator $301_N$ is Droop$_N$. These droop bits are combined together to form the Droop code.

In some embodiments, resistive devices R1 and R2 have programmable or adjustable resistance. In some embodiments, resistive devices R3 and R4 are programmable. For example, Thr_select signal (one or more bits) from FSM 120 can be used to adjust the value of resistances of R3 and R4. Here, the voltage to be detected is provided on VccIO node (e.g., power supply rail of receiver 102). This voltage is filtered on to node Vp though coupling capacitor C1. In some embodiments, comparators $301_{1-N}$ are clocked comparators with offset cancellation. In some embodiments, comparators $301_{1-N}$ includes a latch and an amplifier.

Resistive devices R1 and R2 can be implemented as transistors operating in a linear region, discrete resistors that may be on-die (e.g., poly) or off-chip, or a combination of both transistor and discrete resistors. In some embodiments, capacitor C1 is implemented as a transistor configured in a capacitor, a mesh of metal layers, a metal-insulator-metal capacitor, or any combination of them.

Figure 4:
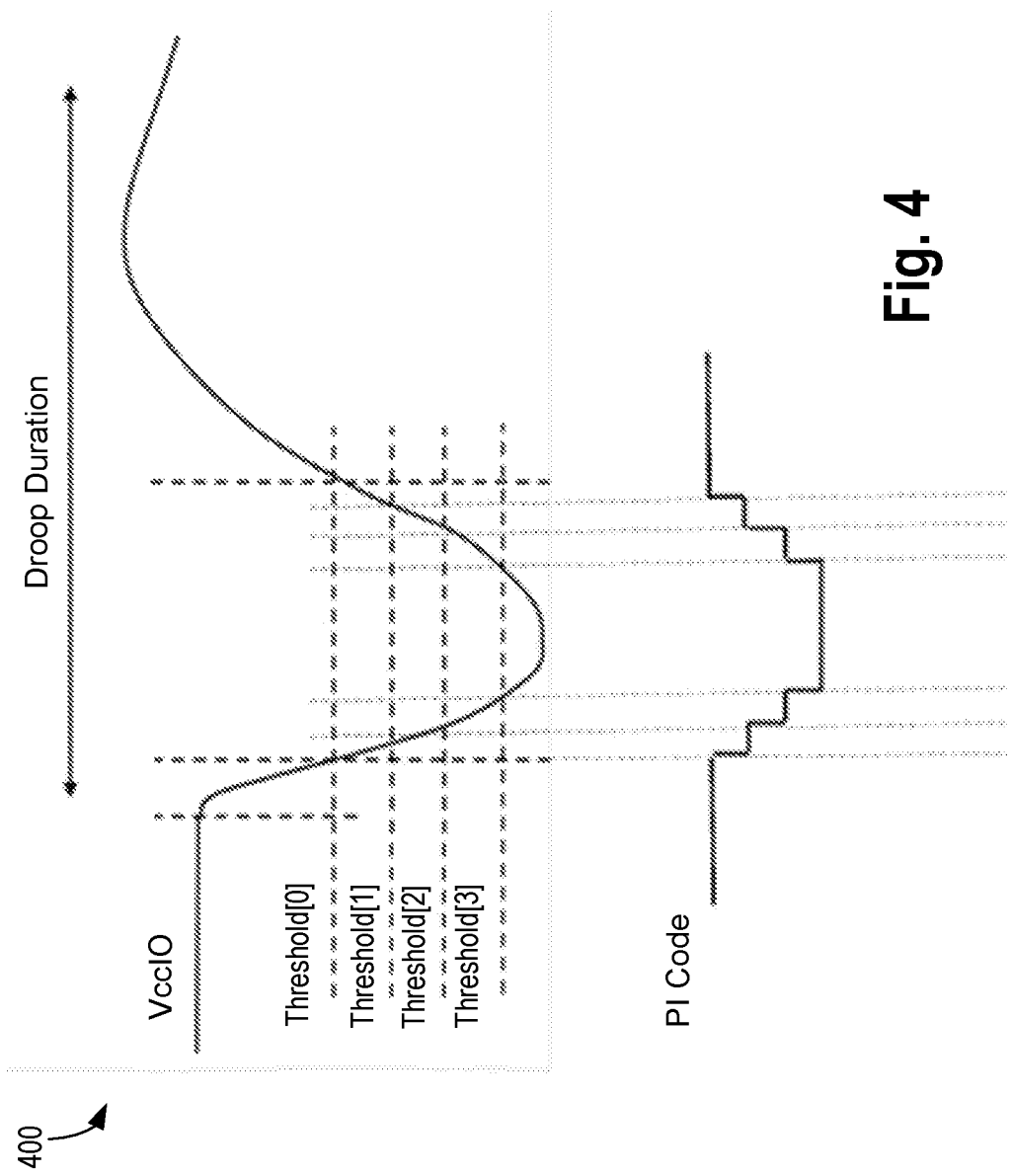
FIG. 4 illustrates a plot showing change in phase interpolator (PI) code for different droop thresholds, in accordance with some embodiments.

FIG. 4 illustrates plot 400 showing change in phase interpolator (PI) code for different droop thresholds, in accordance with some embodiments. In some embodiments, detector 119 includes a plurality of comparators where each comparator has a different threshold, which is compared with the voltage on node Vp. These different thresholds are labeled as Threshold[0], Threshold[1], Threshold[2], Threshold[3], and so on. Each of these threshold voltages is adjustable by Thr_select signal (one or more bits) from FSM 120. Each of the multiple outputs of voltage detector 117 are mapped to a specific PI Code and/or DLL delay code. This mapping of Threshold[0] through Threshold[N], and/or voltage droop or rise points, correspond to a certain PI code and/or DLL delay code. As the voltage droop or rise recovers and the voltage on VccIO settles back to its expected normal level, PI code and DLL delay code also moves back to their expected normal codes.

FIG. 5 illustrates lookup Table 500 (e.g., Table 121) to select an appropriate PI code and/or DLL delay code according to the voltage droop or rise level, in accordance with some embodiments. Table 500 may be implemented as a plurality of registers, non-volatile memory, volatile memory, fuses, etc. While Table 500 is illustrated as an example, fewer or more detail can be added in Table 500 while still able to achieve the function of selecting a PI Code and/or a DLL code that corresponds to a voltage droop or rise in VccIO.

When Droop is '0', FSM 120 allows receiver 120 to perform as normal because VccIO does not experience a droop or rise relative to an expected stable voltage level. In this case, PI Code is selected according to a closed loop system. When Droop is non-zero (e.g., '1'), which indicates a droop or rise in the voltage of VccIO, FSM 120 provides a PI code that depends on the droop or rise in the voltage of VccIO. This PI Code is then used to pull in or push out RxClk edge to cause RxClk edge to be centered in the middle of the DataIn eye. As such, clock phase compensation is performed.

In some embodiments, Table 500 also includes a delay code for DLL 117 to adjust its delay according to a droop or rise in the voltage of VccIO. For example, the DLL delay code adjusts a delay of one or more of the delay stages or cells of DLL 117. Other columns in Table 500 include droop threshold levels (e.g., Thr_select code), threshold voltage (e.g., v1, v2, v3, ... v15) for each comparator 301, PI Code, and DLL delay code. In this example, 15 PI code and DLL code levels are shown. However, any number of PI and DLL codes may be used. Here, PI code represents a fine code and DLL code represents a coarse code for shifting RxClk phase.

Figure 6:
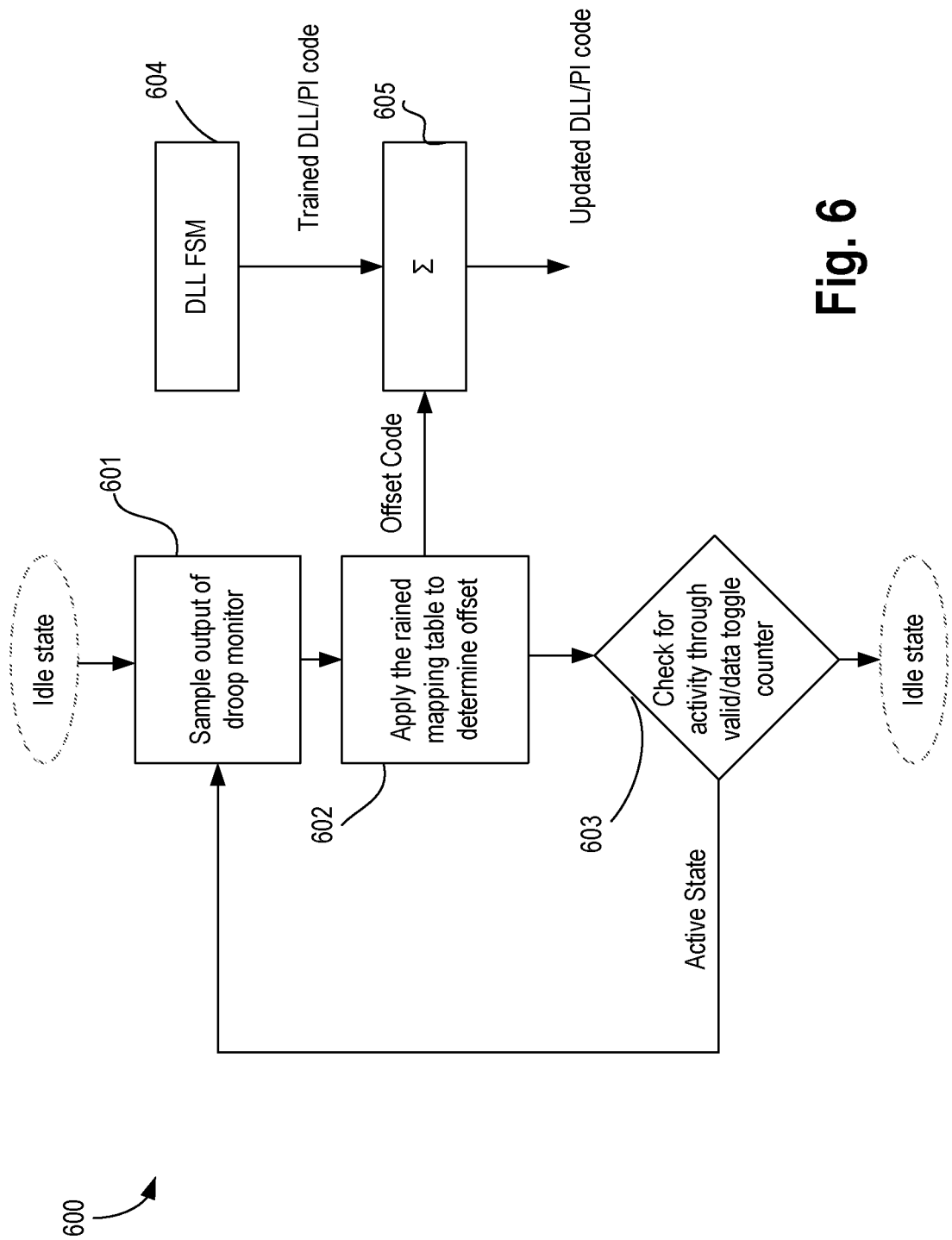
FIG. 6 illustrates a flowchart of a method for clock phase compensation, in accordance with some embodiments.

FIG. 6 illustrates flowchart 600 of a method for clock phase compensation, in accordance with some embodiments. Various blocks are shown in a particular order. However, some blocks can be processed in parallel or simultaneously. Flowchart 600 begins with an idle state. Here, idle state refers to an IO condition when data from transmitter 101 sent to receiver 102 is invalid data. In that case, droop detector 119 can remain off to save power. Upon indication of valid data (e.g., via another signal from transmitter 101), droop detector 119 can be turned on, and droop signal is monitored or sampled at block 601. At block 602, FSM 120 looks at the droop threshold level and selects a PI or DLL code corresponding to the droop threshold level. As such, an offset code is identified from the trained mapping table 121. At block 603, FSM 120 checks for valid data from transmitter 101. For example, value of a valid data toggle counter can be accessed to determine if data from transmitter 101 is valid. If the counter is not toggling, then it may mean that no data is being send by transmitter 101, and droop detector 119 can be turned off. In that case, the process proceeds to an idle state. If there is activity in the counter output indicating incoming valid data from transmitter 101, the process proceeds to block 601 again. The offset code generated by block 602 is then added to the trained DLL or PI code generated by block 604. The RxClk is then pulled in or pushed out according to the updated DLL or PI code so that the sampling edge of RxClk is in the center of the eye.

Figure 7:
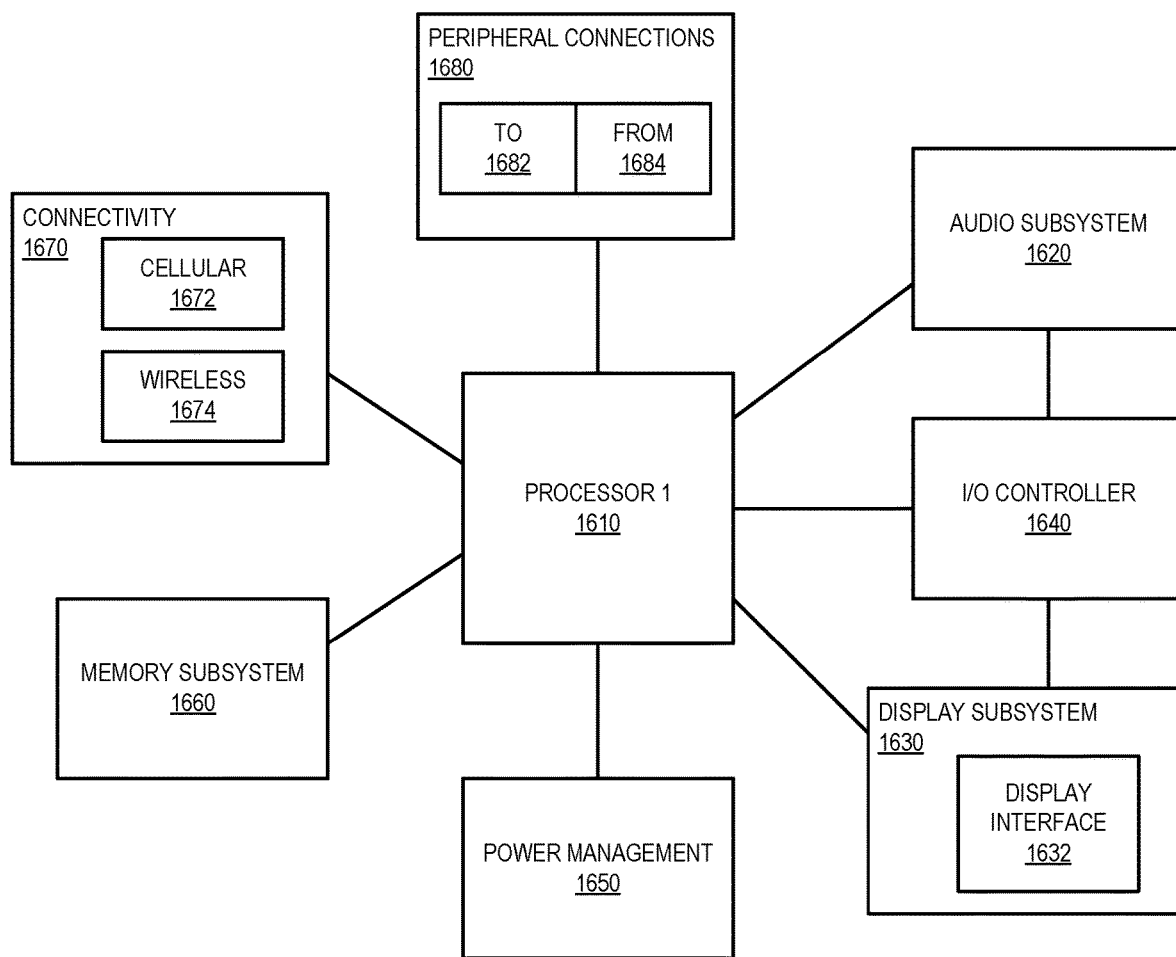
FIG. 7 illustrates a smart device, or a computer system, or a SoC (System-on-Chip) having apparatus to compensate clock phase according to supply voltage droop, according to some embodiments of the disclosure.

FIG. 7 illustrates a smart device, or a computer system, or a SoC (System-on-Chip) having apparatus to compensate clock phase according to supply voltage droop, according to some embodiments of the disclosure. FIG. 7 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes processor with apparatus to compensate clock phase according to supply voltage droop, according to some embodiments discussed. Other blocks of the computing device 1600 may also include an apparatus to compensate clock phase according to supply voltage droop, according to some embodiments. The various embodiments of the present disclosure may also comprise a network interface within 1670 such as a wireless interface so that a system embodiment may be incorporated into a wireless device, for example, cell phone or personal digital assistant.

In some embodiments, processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600 or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples are provided to illustrate the various embodiments. These examples can depend from one another in any suitable manner.

Example 1

An apparatus comprising: a first circuitry to detect a voltage droop or rise at one or more voltage levels; a second circuitry to adjust a phase of an input clock, and to generate an output clock in accordance with the adjusted phase, wherein the second circuitry is to adjust the phase of the input clock in accordance with the detected voltage droop or rise from the first circuitry; and a third circuitry to sample data in accordance with a transition edge of the output clock.

Example 2

The apparatus of example 1, wherein the first circuitry comprises an adjustable threshold for the one or more voltage levels.

Example 3

The apparatus of example 1 comprising a plurality of registers to store a lookup table, wherein the lookup table includes: a first code to adjust the phase of the input clock, wherein the first code corresponds to a first voltage level of the voltage droop or rise; and a second code to adjust the phase of the input clock, wherein the second code corresponds to a second voltage level of the voltage droop or rise.

Example 4

The apparatus of example 3 comprising a finite state machine (FSM) coupled to the first and second circuitries, wherein the FSM is to: select one of the first or second codes for the second circuitry according to a current voltage level of the voltage droop or rise.

Example 5

The apparatus of example 1, comprising a delay locked loop (DLL) coupled to the second circuitry, wherein the DLL is to provide the input clock to the second circuitry.

Example 6

The apparatus of example 1, wherein the third circuitry comprises a strong arm latch (SAL), wherein the SAL is to detect data transmitted by another device, and to sample the data in accordance with the transition edge of the output clock.

Example 7

The apparatus of example 1, wherein the second circuitry comprises a phase interpolator.

Example 8

The apparatus of example 1, wherein the second circuitry comprises a delay locked loop.

Example 9

An apparatus comprising: a droop detector to detect a voltage droop on a power supply rail, wherein the droop detector is to detect at first and second voltage levels; and a phase interpolator (PI) to adjust a phase of an input clock, and to generate an output clock in accordance with the adjusted phase, wherein the PI is to adjust the phase of the input clock by a first delay in accordance with the detected voltage droop or rise at the first voltage level, and to adjust the phase of the input clock by a second delay in accordance with the detected voltage droop or rise at the second voltage level.

Example 10

The apparatus of example 9 comprising: a strong arm latch to sample data in accordance with the output clock.

Example 11

The apparatus of example 10, wherein the power supply rail is an input-output (JO) power supply rail that is to provide power to a receiver comprising the strong arm latch.

Example 12

The apparatus of example 9, wherein the first and second voltage levels are adjustable voltage levels.

Example 13

The apparatus of example 9 comprising a plurality of registers to store a lookup table, wherein the lookup table includes: a first code to adjust the phase of the input clock, wherein the first code corresponds to the first voltage level of the voltage droop or rise; and a second code to adjust the phase of the input clock, wherein the second code corresponds to the second voltage level of the voltage droop or rise.

Example 14

The apparatus of example 13 comprising a finite state machine (FSM) coupled to the droop detector and the PI, wherein the FSM is to: select one of the first or second codes for the PI in accordance with a current voltage level of the voltage droop or rise.

Example 15

The apparatus of example 9 comprising a delay locked loop (DLL) coupled to the PI, wherein the DLL is to provide the input clock to the PI.

Example 16

A system comprising: a first die comprising: a first transmitter to transmit data; a second transmitter to transmit first clock; a third transmitter to transmit a second clock; a second die comprising: a first receiver coupled to the first transmitter via a first transmission medium; a second receiver coupled to the second and third transmitters via second and third transmission media, respectively, wherein the second receiver is to receive the first and second clocks and to combine them to provide a third clock; a delay locked loop (DLL) coupled to the second receiver, wherein the DLL is to receive the third clock; a droop or rise detector to detect a voltage droop or rise on a power supply rail at first and second voltage levels; and a phase interpolator (PI) coupled to the DLL, wherein the PI is to adjust a phase of the third clock, and to generate a fourth clock in accordance with the adjusted phase, wherein the PI is to adjust the phase of the third clock by a first delay in accordance with the detected voltage droop or rise at the first voltage level, and to adjust the phase of the third clock by a second delay in accordance with the detected voltage droop or rise at the second voltage level; and an antenna communicatively coupled to the first and second dies.

Example 17

The system of example 16, wherein the first receiver comprises a strong arm latch to sample data in accordance with the fourth clock.

Example 18

The system of example 16, wherein the power supply rail is an input-output (JO) power supply rail that is to provide power to the first receiver, the second receiver, the DLL, the droop or rise detector, and the PI.

Example 19

The system of example 16, wherein the first and second voltage levels are adjustable voltage levels.

Example 20

The system of example 16 comprising a plurality of registers to store a lookup table, wherein the lookup table includes: a first code to adjust the phase of the third clock, wherein the first code corresponds to the first voltage level of the voltage droop; and a second code to adjust the phase of the third clock, wherein the second code corresponds to the second voltage level of the voltage droop.

Example 21

The system of example 20 comprising a finite state machine (FSM) coupled to the droop detector and the PI, wherein the FSM is to: select one of the first or second codes for the PI according to a current voltage level of the voltage droop or rise.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:
1. An apparatus comprising:
   a first circuitry to detect a voltage droop or rise at one or more voltage levels;
   a second circuitry to adjust a phase of an input clock without adjustment of frequency of the input clock, and to generate an output clock in accordance with the adjusted phase, wherein the second circuitry is to adjust the phase of the input clock in accordance with the detected voltage droop or rise from the first circuitry; and
   a third circuitry to sample data in accordance with a transition edge of the output clock.
2. The apparatus of claim 1, wherein the first circuitry comprises an adjustable threshold for the one or more voltage levels.

3. The apparatus of claim 1 comprising a plurality of registers to store a lookup table, wherein the lookup table includes:
a first code to adjust the phase of the input clock, wherein the first code corresponds to a first voltage level of the voltage droop or rise; and
a second code to adjust the phase of the input clock, wherein the second code corresponds to a second voltage level of the voltage droop or rise.

4. The apparatus of claim 3 comprising a finite state machine (FSM) coupled to the first and second circuitries, wherein the FSM is to: select one of the first or second codes for the second circuitry according to a current voltage level of the voltage droop or rise.

5. The apparatus of claim 1, comprising a delay locked loop (DLL) coupled to the second circuitry, wherein the DLL is to provide the input clock to the second circuitry.

6. The apparatus of claim 1, wherein the third circuitry comprises a strong arm latch (SAL), and wherein the SAL is to detect data transmitted by another device, and to sample the data in accordance with the transition edge of the output clock.

7. The apparatus of claim 1, wherein the second circuitry comprises a phase interpolator.

8. The apparatus of claim 1, wherein the second circuitry comprises a delay locked loop.

9. An apparatus comprising:
a droop or rise detector to detect a voltage droop or rise on a power supply rail, wherein the droop detector is to detect at first and second voltage levels; and
a phase interpolator (PI) to adjust a phase of an input clock, and to generate an output clock in accordance with the adjusted phase, wherein the PI is to adjust the phase of the input clock by a first delay in accordance with the detected voltage droop or rise at the first voltage level, and to adjust the phase of the input clock by a second delay in accordance with the detected voltage droop or rise at the second voltage level.

10. The apparatus of claim 9 comprising: a strong arm latch to sample data in accordance with the output clock.

11. The apparatus of claim 10, wherein the power supply rail is an input-output (TO) power supply rail that is to provide power to a receiver comprising the strong arm latch.

12. The apparatus of claim 9, wherein the first and second voltage levels are adjustable voltage levels.

13. The apparatus of claim 9 comprising a plurality of registers to store a lookup table, wherein the lookup table includes:
a first code to adjust the phase of the input clock, wherein the first code corresponds to the first voltage level of the voltage droop or rise; and
a second code to adjust the phase of the input clock, wherein the second code corresponds to the second voltage level of the voltage droop or rise.

14. The apparatus of claim 13 comprising a finite state machine (FSM) coupled to the droop detector and the PI, wherein the FSM is to: select one of the first or second codes for the PI in accordance with a current voltage level of the voltage droop or rise.

15. The apparatus of claim 9 comprising a delay locked loop (DLL) coupled to the PI, wherein the DLL is to provide the input clock to the PI.

16. A system comprising:
a first die comprising:
a first transmitter to transmit data;
a second transmitter to transmit first clock;
a third transmitter to transmit a second clock;
a second die comprising:
a first receiver coupled to the first transmitter via a first transmission medium;
a second receiver coupled to the second and third transmitters via second and third transmission media, respectively, wherein the second receiver is to receive the first and second clocks and to combine them to provide a third clock;
a delay locked loop (DLL) coupled to the second receiver, wherein the DLL is to receive the third clock;
a droop or rise detector to detect a voltage droop or rise on a power supply rail at first and second voltage levels; and
a phase interpolator (PI) coupled to the DLL, wherein the PI is to adjust a phase of the third clock, and to generate a fourth clock in accordance with the adjusted phase, wherein the PI is to adjust the phase of the third clock by a first delay in accordance with the detected voltage droop or rise at the first voltage level, and to adjust the phase of the third clock by a second delay in accordance with the detected voltage droop or rise at the second voltage level; and
an antenna communicatively coupled to the first and second dies.

17. The system of claim 16, wherein the first receiver comprises a strong arm latch to sample data in accordance with the fourth clock.

18. The system of claim 16, wherein the power supply rail is an input-output (TO) power supply rail that is to provide power to the first receiver, the second receiver, the DLL, the droop detector, and the PI.

19. The system of claim 16, wherein the first and second voltage levels are adjustable voltage levels.

20. The system of claim 16 comprising a plurality of registers to store a lookup table, wherein the lookup table includes:
a first code to adjust the phase of the third clock, wherein the first code corresponds to the first voltage level of the voltage droop or rise; and
a second code to adjust the phase of the third clock, wherein the second code corresponds to the second voltage level of the voltage droop or rise.

21. The system of claim 20 comprising a finite state machine (FSM) coupled to the droop detector and the PI, wherein the FSM is to: select one of the first or second codes for the PI according to a current voltage level of the voltage droop or rise.

* * * * *